United States Patent
Song (10) Patent No.: US 9,917,423 B2
(45) Date of Patent: Mar. 13, 2018

(54) LASER BEAM COMBINATION SYSTEM

(71) Applicant: ELECTRONICS AND TELECOMMUNICATIONS RESEARCH INSTITUTE, Daejeon (KR)

(72) Inventor: Jung Ho Song, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/169,815

(22) Filed: Jun. 1, 2016

(65) Prior Publication Data

US 2016/0380410 A1     Dec. 29, 2016

(30) Foreign Application Priority Data

Jun. 26, 2015    (KR) ......................... 10-2015-0091482

(51) Int. Cl.
*G02B 27/12* (2006.01)
*H01S 5/40* (2006.01)
(Continued)

(52) U.S. Cl.
CPC ........ *H01S 5/4012* (2013.01); *G02B 27/0961* (2013.01); *G02B 27/10* (2013.01);
(Continued)

(58) Field of Classification Search
CPC ...... H01S 5/4012; H01S 5/4025; H01S 5/405; H01S 5/4025; G02B 27/14; G02B 27/123; G02B 27/30; G02B 27/0961; G02B 19/0057; G02B 27/1006; G02B 27/0905; G02B 27/283; G02B 27/0966; G02B 19/0009; G02B 19/0052; G02B 27/10; G02B 6/12004

See application file for complete search history.

(56) References Cited

U.S. PATENT DOCUMENTS 5,541,951 A * 7/1996 Juhasz ................ H01S 3/09415
372/101
7,027,228 B2   4/2006 Mikhailov
(Continued)

OTHER PUBLICATIONS

Udo Fornahl et al., "High efficient fiber coupling of laser diode bars with > 50% electro-optical efficiency out of the fiber core", High-Power Diode Laser Technology and Applications VI, Proc. of SPIE vol. 6876, pp. 68760X-1-68760X-10, Feb. 13, 2008.

*Primary Examiner* — Alicia M Harrington
(74) *Attorney, Agent, or Firm* — Rabin & Berdo, P.C.

(57) ABSTRACT

Provided herein is a laser beam combination system. The laser beam combination system includes a laser emitter array including a plurality of laser emitters arranged therein, a first combination lens, through which a plurality of laser beams emitted from the laser emitters are concentrated in a first axis direction, so that the plurality of laser beams are converted to each have an oval cross-section having a long axis that is parallel to a second axis, and a second combination lens disposed at a focal point of the first combination lens to combine the plurality of laser beams converted by the first combination lens at a predetermined target.

18 Claims, 10 Drawing Sheets

(51) Int. Cl.
*G02B 27/09* (2006.01)
*G02B 27/30* (2006.01)
*G02B 27/10* (2006.01)
*H01S 3/094* (2006.01)

(52) U.S. Cl.
CPC .......... *G02B 27/123* (2013.01); *G02B 27/30* (2013.01); *H01S 3/094003* (2013.01); *H01S 5/4025* (2013.01)

(56) References Cited

U.S. PATENT DOCUMENTS

| | | |
|---|---|---|
| 7,848,372 B2 | 12/2010 | Schulte et al. |
| 8,248,700 B1 | 8/2012 | Zorabedian |
| 2005/0078383 A1 | 4/2005 | Jones et al. |
| 2011/0305256 A1* | 12/2011 | Chann ................ G02B 27/0905 372/75 |
| 2013/0258469 A1* | 10/2013 | Park .................... G02B 27/283 359/485.01 |
| 2013/0287339 A1 | 10/2013 | Song et al. |
| 2014/0126062 A1 | 5/2014 | Heo et al. |

* cited by examiner

LASER BEAM COMBINATION SYSTEM

CROSS-REFERENCE TO RELATED APPLICATION

The present application claims priority to Korean patent application number 10-2015-0091482 filed on Jun. 26, 2015 the entire disclosure of which is incorporated herein in its entirety by reference.

BACKGROUND

Field of Invention

Various embodiments of the present disclosure relate to a laser beam combination system.

Description of Related Art

A plurality of laser beams may be combined to increase power when power of one laser beam, which is in use, is insufficient. Examples of a method of combining the plurality of laser beams may include coherent beam combining, spectral beam combining, and geometrical beam combining methods.

When the plurality of laser beams are combined using the geometrical method, phases or wavelengths of the laser beams may not be adjusted. Accordingly, costs are low, and power of the beam may be increased using a relatively easy method. Particularly, the geometrical method may be representatively used when laser diode beams for pumps used in an optical fiber laser are combined.

The laser diode is a semiconductor light source, and is frequently used as a pumping light source for a solid state laser or an optical fiber laser.

Figure 1:
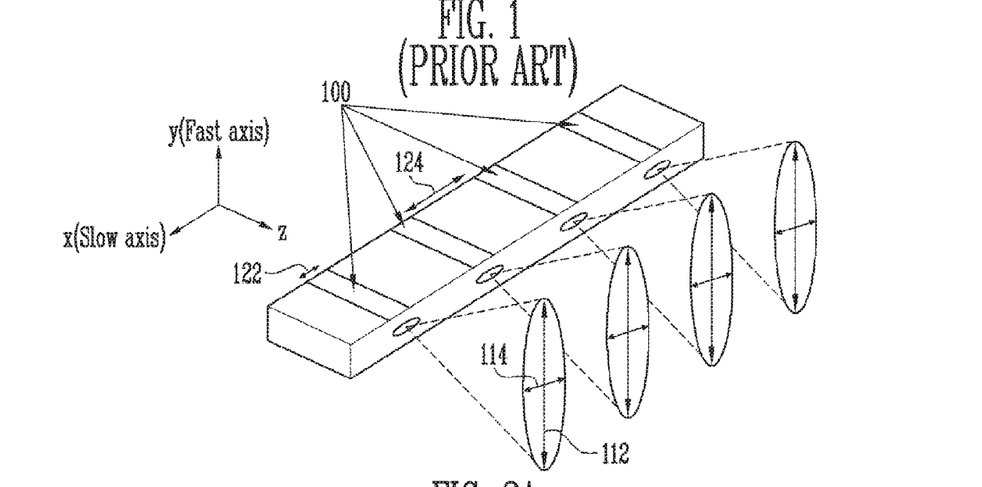
FIG. 1 is a view showing a type of laser beam radiated from a laser diode bar.

FIG. 1 is a view showing a type of beam radiated from a laser diode bar.

As shown in FIG. 1, the beam is radiated from the laser diode at a large radiation angle 112 in a y-axis direction, which is perpendicular to an arrangement direction of radiators 100, that is, a fast axis direction, and at a small radiation angle 114 in an x-axis direction, which is parallel to the arrangement direction of the radiators 100, that is, a slow axis direction.

A cylindrical lens having a high numerical aperture (hereinafter, 'NA') should be used in order to collimate the fast axis beams having the large radiation angle. The quality of the beam is improved as the width 122 of the single radiator is reduced, and heat is easily emitted as the interval 124 between the radiators is increased. That is, there are spaces, through which light is not emitted, between the radiators, and the spaces may act as a factor reducing the quality of the beam. Further, when the laser diode is combined with the optical fiber, the quality of the beam may be reduced due to asymmetry between the fast axis and the slow axis.

Figure 2A:
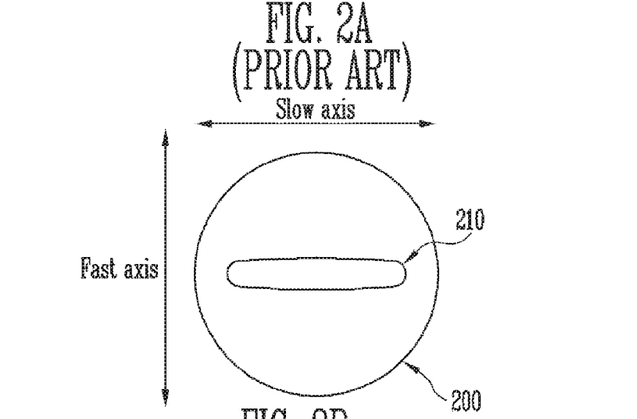
FIGS. 2A and 2B are views schematically showing beam types of optical fibers.
Figure 2B:
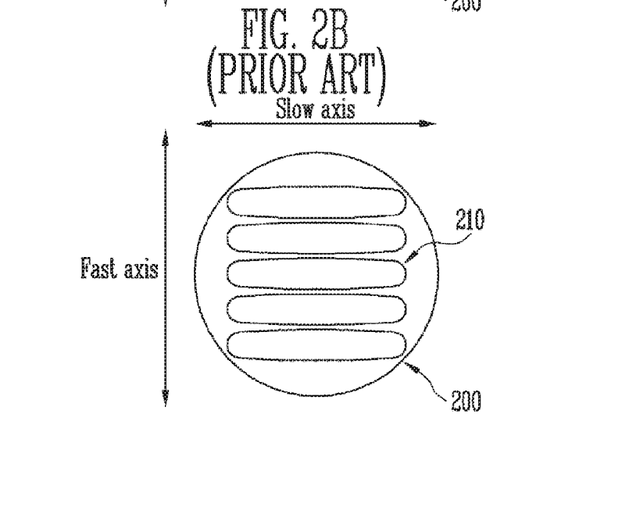

FIGS. 2A and 2B are views showing beam patterns at ends of optical fibers. When a long rectangular beam 210 of the single radiator is received using the optical fiber, large empty spaces are formed in a fast axis direction as in FIG. 2A. In order to solve the aforementioned problem, a technology using a stair-type heat sink has been proposed.

Specifically, laser diodes may be disposed so that beams are stacked to increase the total height of the beams in a fast axis direction, and accordingly, the beams emitted from the laser diodes may be combined to form a square shown in FIG. 2B, thereby increasing the light filling efficiency of the optical fibers. However, the technology has a drawback in that since very precise processing is required when the stair-type heat sink is manufactured, it is difficult to perform the manufacturing process.

SUMMARY

Various embodiments of the present disclosure are directed to solve the problems of the related art.

Furthermore, various embodiments of the present disclosure are directed to provide a laser beam combination system for combining a plurality of laser beams with the high combination efficiency to generate high-intensity light.

The following representative constitutions of the present disclosure are provided in order to accomplish the aforementioned embodiments.

One embodiment of the present disclosure provides a laser beam combination system including a laser emitter array including a plurality of laser emitters arranged therein, a first combination lens, through which a plurality of laser beams emitted from the laser emitters are concentrated in a first axis direction, so that the plurality of laser beams are converted to each have an oval cross-section having a long axis that is parallel to a second axis, and a second combination lens disposed at a focal point of the first combination lens to combine the plurality of laser beams converted by the first combination lens at a predetermined target.

According to the present disclosure, laser beams may be combined using first and second combination lenses with the high combination efficiency to generate high-power light.

The laser beams may be combined using a laser diode bar to reduce the number of required parts and the assembling cost.

Furthermore, fourth combination lenses, which are disposed to have different heights, may be used to prevent a smile phenomenon from occurring, thereby increasing the combination efficiency.

In addition, single mode pulse-type laser beams may be combined to increase a pulse repetition rate while high peak power is maintained.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. The term "and/or" includes any and all combinations of one or more of the associated listed items.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Hereinafter, embodiments will be described in greater detail with reference to the accompanying drawings. Throughout the disclosure, the same reference numerals refer to the same parts in order to easily understand the figures and embodiments of the present disclosure, and the overlapping descriptions of the same parts may be omitted.

Figure 3:
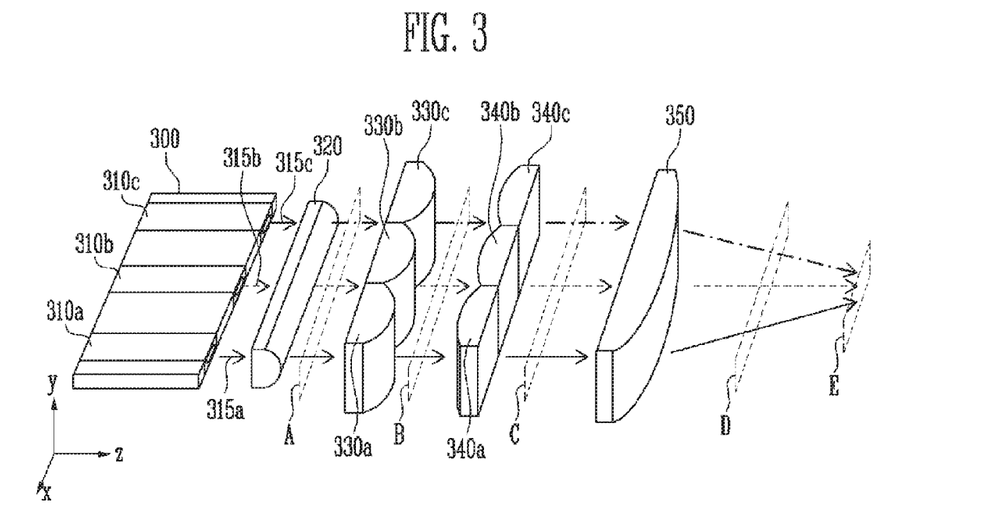
FIG. 3 is a view showing a schematic constitution of a laser beam combination system according to an embodiment of the present disclosure.

FIG. 3 is a view showing a schematic constitution of a laser beam combination system according to an embodiment of the present disclosure.

As shown in FIG. 3, the laser beam combination system according to the embodiment of the present disclosure may include a laser emitter array 300 including a plurality of laser emitters 310a, 310b, and 310c arranged therein, a first collimation lens 320, second collimation lenses 330a, 330b, and 330c, first combination lenses 340a, 340b, and 340c, and a second combination lens 350.

Meanwhile, as shown in FIG. 3, in the present specification, an axis, which is parallel to an arrangement direction of the laser emitter array 300, is set to an x axis (or a slow axis or a first axis), an axis, which is parallel to a progress direction of laser beams 315a, 315b, and 315c emitted from the laser emitters 310a, 310b, and 310c, is set to a z axis (or a third axis), and an axis, which is perpendicular to the x axis and the z axis, is set to a y-axis (or a fast axis or a second axis).

The laser emitters 310a, 310b, and 310c may be a semiconductor laser, and particularly, a laser diode. The plurality of laser emitters 310a, 310b, and 310c may be arranged to form the laser emitter array 300. The plurality of laser emitters 310a, 310b, and 310c may be arranged on the same plane (plane including the x axis and the z axis). Specifically, a laser diode bar including the plurality of laser emitters 310a, 310b, and 310c provided on one substrate may be used as the laser emitter array 300.

According to the present disclosure, the laser beams 315a, 315b, and 315c emitted from the laser emitters 310a, 310b, and 310c may first pass through the first collimation lens 320. As shown in FIG. 3, the first collimation lens 320 (fast-axis collimator) may be a cylindrical lens having a curvature in a y-axis direction, and may function to collimate the laser beams 315a, 315b, and 315c emitted from the laser emitters 310a, 310b, and 310c.

Next, the laser beams passing through the first collimation lens 320 may pass through the second collimation lenses 330a, 330b, and 330c (slow-axis collimator). As shown in FIG. 3, the second collimation lenses 330a, 330b, and 330c may be a cylindrical lens having a curvature in an x-axis direction, and may be provided to correspond in number to the plurality of laser emitters 310a, 310b, and 310c. The second collimation lenses 330a, 330b, and 330c may correspond to the laser emitters 310a, 310b, and 310c, respectively.

That is, the laser beam 315a emitted from the laser emitter of reference numeral 310a may pass through the second collimation lens of reference numeral 330a, the laser beam 315b emitted from the laser emitter of reference numeral 310b may pass through the second collimation lens of reference numeral 330b, and finally, the laser beam 315c emitted from the laser emitter of reference numeral 310c may pass through the second collimation lens of reference numeral 330c.

The plurality of laser beams 315a, 315b, and 315c pass through the first collimation lens 320 and the second collimation lenses 330a, 330b, and 330c to be collimated into the laser beams each having a circular cross-section.

Next, the laser beams 315a, 315b, and 315c collimated by the first collimation lens 320 and the second collimation lenses 330a, 330b, and 330c may sequentially pass through the first combination lenses 340a, 340b, and 340c and the second combination lens 350 positioned at focal distances of the first combination lenses 340a, 340b, and 340c to be combined at a predetermined target.

The first combination lenses 340a, 340b, and 340c may be a cylindrical lens having a curvature in an x-axis direction, and may be provided to correspond in number to the plurality of laser emitters 310a, 310b, and 310c. The first combination lenses 340a, 340b, and 340c may correspond to the laser emitters 310a, 310b, and 310c, respectively.

That is, for the laser beams passing through the second collimation lenses 330a, 330b, and 330c, the laser beam of reference numeral 315a may pass through the first combination lens of reference numeral 340a, the laser beam of reference numeral 315b may pass through the first combination lens of reference numeral 340b, and the laser beam of reference numeral 315c may pass through the first combination lens of reference numeral 340c.

With regard to arrangement of the laser beams 315a, 315b, and 315c collimated by the first collimation lens 320 and the second collimation lenses 330a, 330b, and 330c, the laser beams 315a, 315b, and 315c pass through the first combination lenses 340a, 340b, and 340c to be concentrated in an x-axis direction. The laser beams 315a, 315b, and 315c, which are collimated to have a circular cross-section, are converted into the laser beams having an oval cross-section having a long axis that is parallel to the y axis.

The second combination lens 350 may be positioned at the focal distances of the first combination lenses 340a, 340b, and 340c, and may have a curvature in the x-axis direction. The second combination lens 350 may be a single cylindrical lens. That is, the plurality of laser beams 315a, 315b, and 315c passing through the second combination lens 350 may be combined. Therefore, the laser beams 315a, 315b, and 315c passing through the first combination lenses 340a, 340b, and 340c pass through the second combination lens 350 to be combined into one beam having a circular cross-section at the focal distance of the second combination lens 350.

FIGS. 4 to 8 are views showing types of laser beams on planes A to E of FIG. 3.

Figure 4:
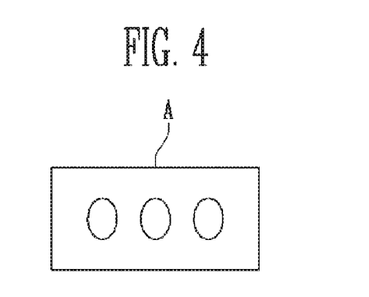
FIGS. 4 to 8 are views showing types of laser beams on planes A to E of FIG. 3.
Figure 5:
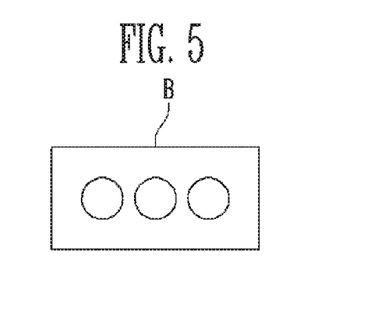

As shown in FIGS. 4 and 5, the laser beams 315a, 315b, and 315c emitted from the laser emitters 310a, 310b, and 310c may pass through the first collimation lens 320 and the second collimation lenses 330a, 330b, and 330c and thus be collimated to each have a circular cross-section.

Figure 6:
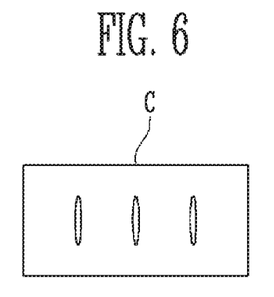

Next, the laser beams 315a, 315b, and 315c, which are collimated to each have the circular cross-section shown in FIG. 5, may pass through the first combination lenses 340a, 340b, and 340c to be concentrated in the x-axis direction and be converted into the laser beams having an oval cross-section having a long axis that is parallel to the y axis, shown in FIG. 6.

Figure 7:
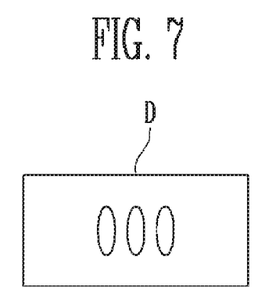
Figure 8:
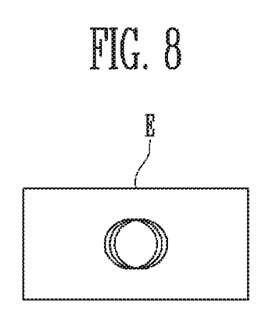

Finally, as shown in FIGS. 7 and 8, intervals between the laser beams 315a, 315b, and 315c passing through the second combination lens 350 are gradually reduced toward the focal distance of the second combination lens 350, and the laser beams are combined with each other at the focal distance. Further, a difference in length of long and short axes of the laser beams 315a, 315b, and 315c, which pass through the first combination lenses 340a, 340b, and 340c and thus are converted to have the oval cross-section, may be gradually reduced toward the focal distance of the second combination lens 350 after the laser beams pass through the second combination lens 350, and accordingly, the laser beams 315a, 315b, and 315c may be converted to have the circular cross-section at the focal distance of the second combination lens 350.

Hereinafter, combination of the laser beams, which are combined using the laser beam combination system according to the embodiment of the present disclosure, with an optical fiber will be described.

Figure 9:
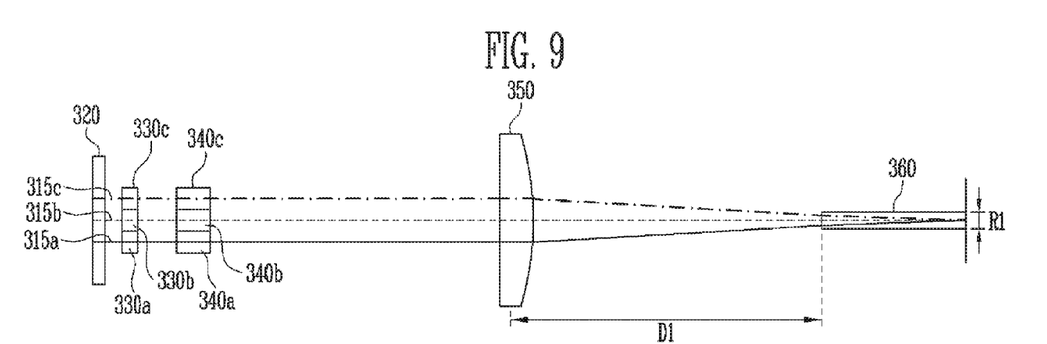
FIG. 9 is a view schematically showing an optical system that includes a laser beam combination system and a predetermined optical fiber according to the embodiment of the present disclosure.

FIG. 9 schematically shows an optical system that includes a laser beam combination system and an optical fiber according to the embodiment of the present disclosure, and is a view shown based on plane x-z.

As shown in FIG. 9, an optical fiber 360 may be provided at the focal distance of the second combination lens 350 so as to combine the laser beams, which are combined using the laser beam combination system according to the embodiment of the present disclosure, with the optical fiber 360.

The laser beams, which are combined at a side of the optical fiber 360, may progress through the optical fiber 360 and then be emitted from the other side of the optical fiber 360.

Combination efficiency of the laser beams according to the embodiment of the present disclosure The combination efficiency of the laser beams may be expected when constitutional elements of the optical system shown in FIG. 9 have the following specific characteristics.

First, laser diodes are used as the three laser emitters. The laser diodes each have a light-emitting area width of 50 μm, a thickness of 1 μm, and a divergence angle of 68° in a y-axis direction and 17° in an x-axis direction at a point at which the intensity of laser beam is $1/e^2$. An interval between the laser diodes is 500 μm.

Next, an aspherical cylindrical lens having a focal distance of 0.3 mm and a numerical aperture (hereinafter, referred to as 'NA') of 0.68 is used as the first collimation lens 320. A cylindrical lens array having a focal distance of 1.2 mm and a lens interval of 0.5 mm, which is the same as the laser diode interval, is used as the second collimation lenses 330a, 330b, and 330c.

Next, a lens array having a focal distance of 11.1 mm and a lens interval of 0.5 mm, which is the same as the laser diode interval, is used as the first combination lenses 340a, 340b, and 340c, and a single lens having the same focal distance as the first combination lenses 340a, 340b, and 340c is used as the second combination lens 350.

The target, at which the laser beams are concentrated, is the optical fiber 360 having a core diameter R1 of 400 μm and a NA of 0.13.

In this case, the combination efficiency of the laser beams 315a, 315b, and 315c, which are emitted from the laser diodes, sequentially pass through the first collimation lens 320, the second collimation lenses 330a, 330b, and 330c, the first combination lenses 340a, 340b, and 340c, and the second combination lens 350, and are combined at the optical fiber 360, may be expected to be 90%.

Hereinafter, combination of laser beams, which are combined using a laser beam combination system according to a second embodiment of the present disclosure, with an optical fiber will be described.

Figure 10:
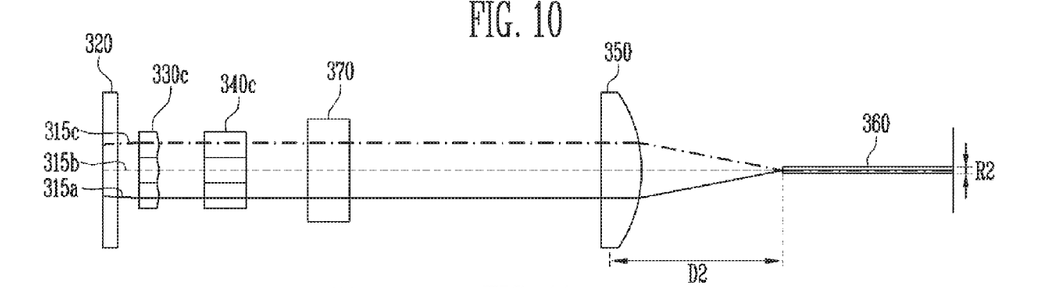
FIGS. 10 and 11 are views schematically showing an optical system that includes a laser beam combination system and an optical fiber according to a second embodiment of the present disclosure.
Figure 11:
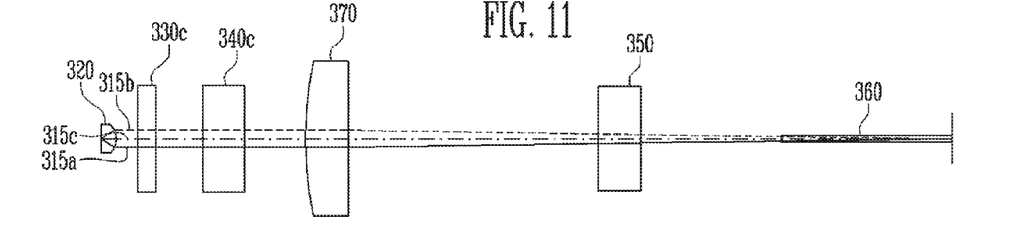

FIGS. 10 and 11 schematically show an optical system that includes the laser beam combination system and the optical fiber according to the second embodiment of the present disclosure, and are views shown based on planes x-z and y-z.

Referring to FIGS. 10 and 11, the laser beam combination system according to the second embodiment of the present disclosure may further include a third combination lens 370 positioned between the first combination lenses 340a, 340b, and 340c and the second combination lens 350. The third combination lens 370 is a cylindrical lens having a curvature in a y-axis direction, and may function to adjust the size of the laser beams, which are combined at a predetermined target, in the y-axis direction.

In order to apply the combined laser beams to various optical fibers, the size of the combined laser beams having a circular cross-section needs to be adjusted, depending on the core diameter of the optical fiber.

According to the present disclosure, the third combination lens 370 may be further provided to reduce the size of the laser beam in the y-axis direction. Further, the size of the laser beam in the x-axis direction may be reduced using the second combination lens 350 having the short focal distance.

Combination efficiency of the laser beams according to the second embodiment of the present disclosure The combination efficiency of the laser beams may be expected when constitutional elements of the optical systems shown in FIGS. 10 and 11 have the following specific characteristics.

For example, when characteristics of the laser diodes 310a, 310b, and 310c, the first collimation lens 320, the second collimation lenses 330a, 330b, and 330c, and the first combination lenses 340a, 340b, and 340c are the same as those in the case where the combination efficiency of the laser beams according to the embodiment of the present disclosure is expected, and when the laser beams are combined at the optical fiber 360 having the core diameter R2 of 100 μm and the NA of 0.13, the size of the combined beams needs to be reduced by the reduced core diameter R2.

The size of beam in the x-axis direction may be reduced using the second combination lens 350 having the focal distance of 4.4 mm, which is smaller than D1 of FIG. 9, and the third combination lens 370 may be provided between the first combination lenses 340a, 340b, and 340c and the second combination lens 350 to reduce the size of the beam in the y-axis direction. The third combination lens 370 may be a cylindrical lens having a focal distance of 13.3 mm.

According to the laser beam combination system having the aforementioned characteristics, the combination efficiency of the laser beams may be expected to be 86%.

Figure 12:
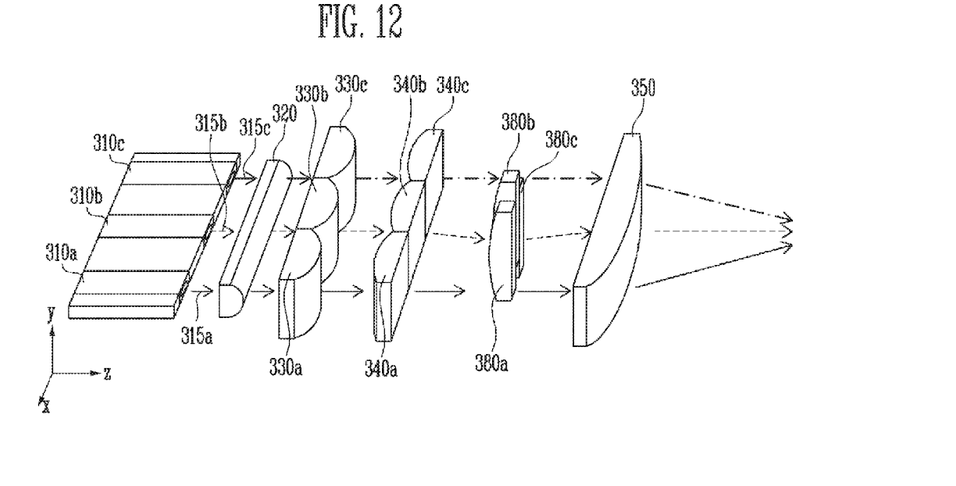
FIG. 12 is a view schematically showing a laser beam combination system according to a third embodiment of the present disclosure.
Figure 13:
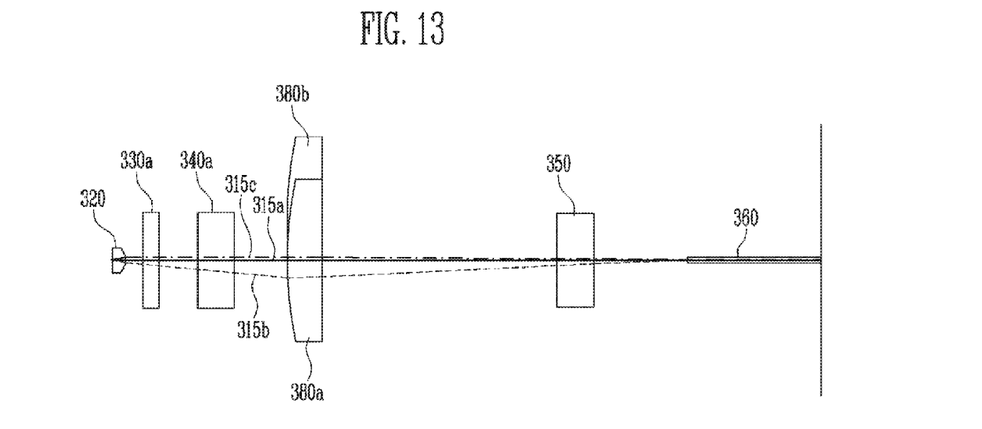
FIG. 13 is a view schematically showing an optical system that includes the laser beam combination system shown in FIG. 12 and an optical fiber.

FIG. 12 is a view schematically showing a laser beam combination system according to a third embodiment of the present disclosure, and FIG. 13 is a view schematically showing an optical system that includes the laser beam combination system shown in FIG. 12 and an optical fiber.

As shown in FIGS. 12 and 13, the laser beam combination system according to the third embodiment of the present disclosure may further include fourth combination lenses 380a, 380b, and 380c.

The fourth combination lenses 380a, 380b, and 380c may be provided to be positioned between the first combination lenses 340a, 340b, and 340c and the second combination lens 350, and may be provided to correspond in number to the first combination lenses 340a, 340b, and 340c. The fourth combination lenses 380a, 380b, and 380c may correspond to the first combination lenses 340a, 340b, and 340c, respectively.

The fourth combination lenses 380a, 380b, and 380c may be provided so that a y-axis center coordinate of at least one 380b of a plurality of fourth combination lenses 380a, 380b, and 380c is different from y-axis center coordinates of the residual fourth combination lenses 380a and 380c. That is, any one fourth combination lens of the plurality of the fourth combination lenses 380a, 380b, and 380c may be provided to protrude in the y-axis direction.

Radiation positions of the laser diodes provided in the laser diode bar may not be on a straight line due to defects during manufacturing or stress during packaging. In serious cases, the radiation positions may deviate from the straight line by several micrometers and thus be on a curved line, causing a smile phenomenon.

For example, as shown in FIGS. 12 and 13, the laser beam corresponding to reference numeral 315b may progress toward a side under the y-axis coordinate of the optical fiber 360 due to the smile phenomenon.

The laser beam corresponding to reference numeral 315b may pass through the fourth combination lens 380b having the large y-axis center coordinate so that a progress direction of the laser beam is upwardly adjusted to come close to the y-axis coordinate of the optical fiber 360.

That is, after the plurality of fourth combination lenses 380a, 380b, and 380c are provided to correspond to the plurality of laser emitters 310a, 310b, and 310c, respectively, the y-axis center coordinate of any one fourth combination lens may be adjusted, depending on the progress direction of the laser beams 315a, 315b, and 315c, thereby improving the combination quality of the laser beams.

FIGS. 14 to 17 are views showing a process of converting the laser beams in a phase space in the laser beam combination system according to the embodiment of the present disclosure.

In FIGS. 14 to 17, the x axis represents the x axis of FIG. 3, that is, the position of the laser beam on the slow axis, and Px is a momentum and the radiation angle of the laser beam in the x direction. The y axis represents the y axis of FIG. 3, that is, the position of the laser beam on the fast axis, and Py is a momentum the radiation angle of the laser beam in the y direction. Meanwhile, the area in the phase space is not changed even after the laser beam passes through constitution elements of the laser beam combination system.

Figure 14:
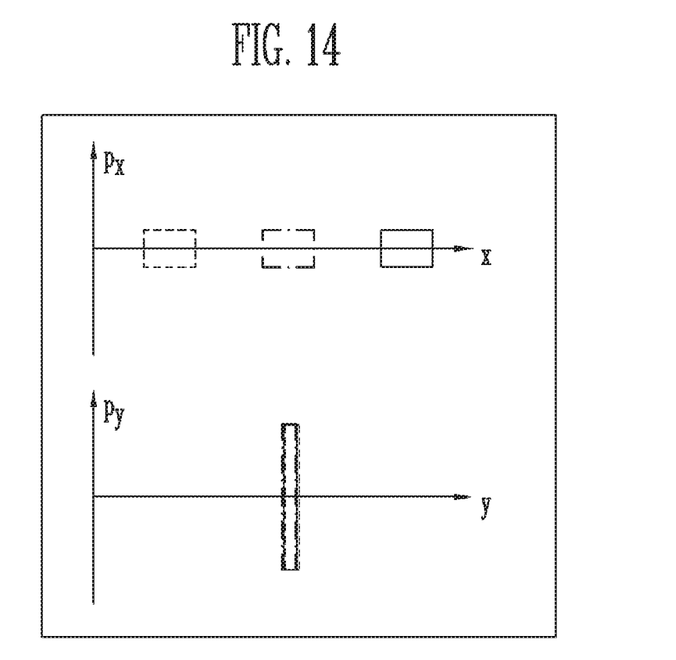
FIGS. 14 to 17 are views showing a process of converting laser beams in a phase space in the laser beam combination system according to the embodiment of the present disclosure.

FIG. 14 shows that the laser beams 315a, 315b, and 315c, which are emitted from the laser emitters 310a, 310b, and 310c, are represented in the phase space, and the x-axis center coordinates of the laser beams 315a, 315b, and 315c are separated but the y-axis center coordinates may be the same. Since the radiation angle of the laser beam in the y-axis direction is larger than the radiation angle of the laser beam in the x-axis direction, the Py value is larger than the Px value. Accordingly, as shown in FIG. 14, the rectangle may be represented to have the large height in the phase space.

Figure 15:
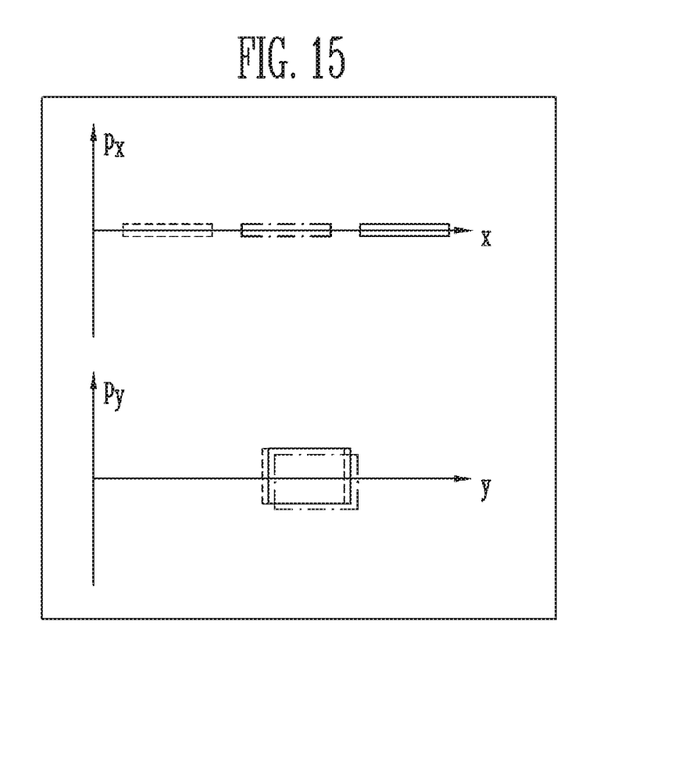

FIG. 15 shows that the laser beams 315a, 315b, and 315c, which pass through the first collimation lens 320 and the second collimation lenses 330a, 330b, and 330c, are represented in the phase space. As shown in FIG. 15, the laser beams 315a, 315b, and 315c, which are collimated in x and y axes by the first collimation lens 320 and the second collimation lenses 330a, 330b, and 330c, may be arranged while being converted to have a rectangle shape having a small height and a large width.

Figure 16:
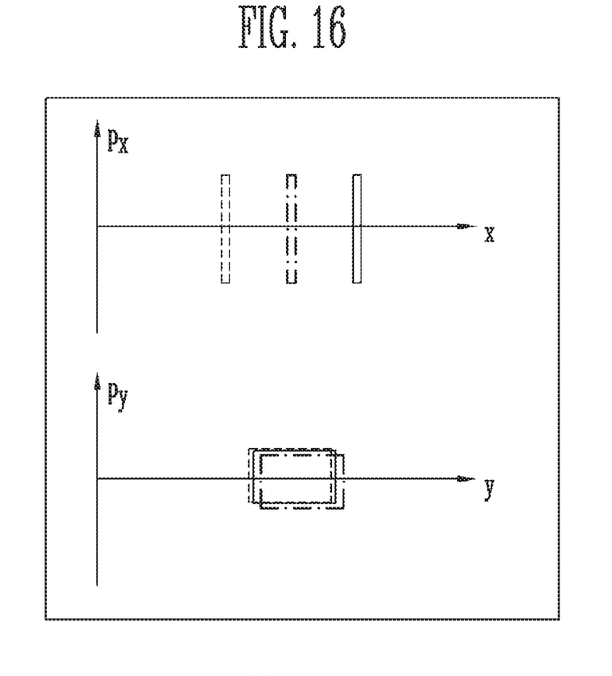

FIG. 16 is a view showing that the laser beams 315a, 315b, and 315c, which pass through the first combination lenses 340a, 340b, and 340c, are represented in the phase space. Since the laser beams 315a, 315b, and 315c are concentrated in the x-axis direction by the first combination lenses 340a, 340b, and 340c, the rectangle has the small width and the large height in the phase space as in FIG. 16.

Figure 17:
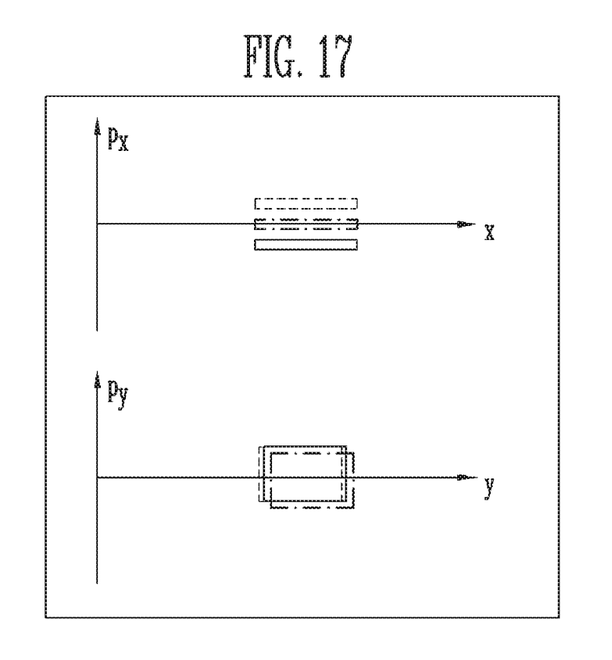

FIG. 17 is a view showing that the laser beams 315a, 315b, and 315c at the focal distance of the second combination lens 350 are represented in the phase space. The x-axis center coordinates of the laser beams 315a, 315b, and 315c are concentrated at the focal point of the second combination lens 350 by the second combination lens 350. That is, as shown in FIG. 17, rectangles are arranged.

Meanwhile, since the x-axis widths of the laser beams 315a, 315b, and 315c passing through the first combination lenses 340a, 340b, and 340c are very small, the laser beams 315a, 315b, and 315c may not be affected by the curved surface of the second combination lens 350 while passing through the second combination lens 350. Therefore, the x-axis widths of the laser beams 315a, 315b, and 315c are gradually increased while the laser beams 315a, 315b, and 315c pass through the second combination lens 350 which is the focal surface of the first combination lenses 340a, 340b, and 340c.

Further, when the focal distances of the first combination lenses 340a, 340b, and 340c are the same as the focal distance of the second combination lens 350, the combination position of the laser beams 315a, 315b, and 315c is far from the first combination lenses 340a, 340b, and 340c by the double focal distance. Accordingly, the x-axis widths of the laser beams 315a, 315b, and 315c at the combination position of the laser beams 315a, 315b, and 315c are the same as the widths of the laser beams 315a, 315b, and 315c which are incident on the first combination lenses 340a, 340b, and 340c.

Figure 18:
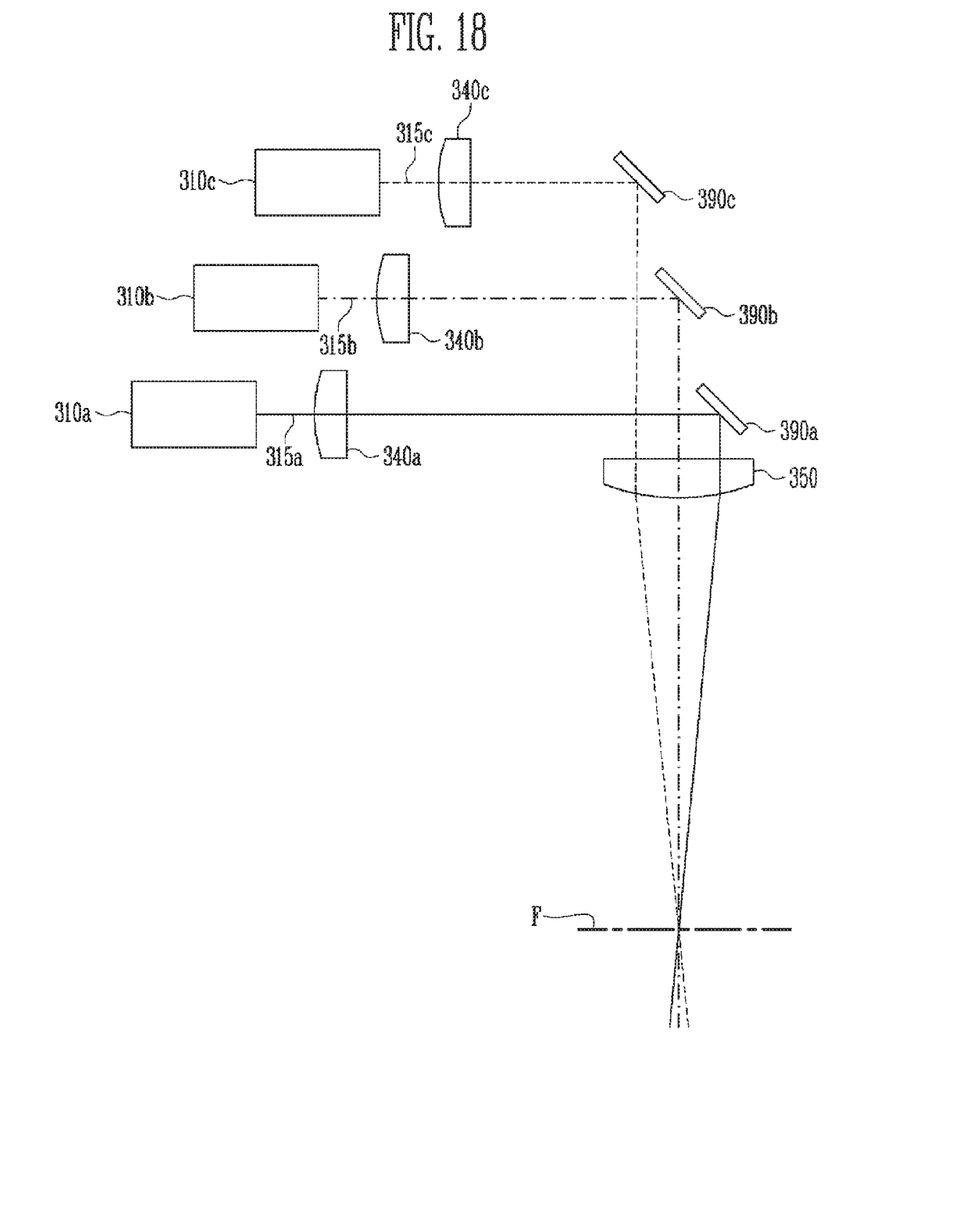
FIG. 18 is a view schematically showing a laser beam combination system according to a fourth embodiment of the present disclosure.

FIG. 18 is a view schematically showing a laser beam combination system according to a fourth embodiment of the present disclosure.

As shown in FIG. 18, the laser beam combination system according to the fourth embodiment of the present disclosure may further include first reflectors 390a, 390b, and 390c.

The first reflectors 390a, 390b, and 390c may be provided to be positioned between the first combination lenses 340a, 340b, and 340c and the second combination lens 350. Specifically, the progress direction of the laser beams 315a, 315b, and 315c passing through the first combination lenses 340a, 340b, and 340c may be changed at an angle of 90° based on the first reflectors 390a, 390b, and 390c, and then be incident on the second combination lens 350.

The first reflectors 390a, 390b, and 390c may be provided to correspond in number to a plurality of laser emitters 310a, 310b, and 310c. The first reflectors 390a, 390b, and 390c may correspond to the laser emitters 310a, 310b, and 310c, respectively. For example, the laser beam 315a emitted from the laser emitter of reference numeral 310a may be reflected by the first reflector of reference numeral 390a, the laser beam 315b emitted from the laser emitter of reference numeral 310b may be reflected by the first reflector of reference numeral 390b, and the laser beam 315c emitted from the laser emitter of reference numeral 310c may be reflected by the first reflector of reference numeral 390c.

The first reflectors 390a, 390b, and 390c may function to reduce the intervals between the laser beams 315a, 315b, and 315c passing through the first combination lenses 340a, 340b, and 340c. Therefore, the first reflectors 390a, 390b, and 390c may be disposed so that the intervals between the x-axis coordinates of the first reflectors 390a, 390b, and 390c are the same as the intervals between the laser emitters 310a, 310b, and 310c and the intervals between the z-axis coordinates of the first reflectors 390a, 390b, and 390c are smaller than the intervals between the laser emitters 310a, 310b, and 310c.

Referring to FIG. 17, the center coordinates of Px of the two laser beams 315a and 315c positioned at both sides may have a value other than zero (0). In this case, the intervals between the laser beams 315a, 315b, and 315c may be reduced so that both the center coordinate values of Px of the beams are adjusted to come close to 0, thereby increasing the combination efficiency.

According to the fourth embodiment of the present disclosure, since the intervals between the laser beams 315a, 315b, and 315c are reduced due to the first reflectors 390a, 390b, and 390c, the combination efficiency may be increased even when it is difficult to arrange the laser emitters 310a, 310b, and 310c with small intervals.

The first reflectors 390a, 390b, and 390c may have the sizes that are enough to receive the laser beams 315a, 315b, and 315c and prevent the laser beams 315a, 315b, and 315c from being obstructed when the intervals between the z-axis coordinates of the first reflectors 390a, 390b, and 390c are reduced. It is preferable to reduce the size while the aforementioned conditions are satisfied.

Since the laser beams 315a, 315b, and 315c pass through the first combination lenses 340a, 340b, and 340c to be concentrated in the x-axis direction, the first reflectors 390a, 390b, and 390c may be disposed so as to be as close to the focal distances of the first combination lenses 340a, 340b, and 340c as possible. Further, the positions of the first reflectors 390a, 390b, and 390c may be determined so that the second combination lens 350 is disposed at the focal distances of the first combination lenses 340a, 340b, and 340c.

Meanwhile, it is apparent that the first collimation lens and the second collimation lens, which are not shown in FIG. 18 for the convenience of description, may be provided between the laser emitter and the first combination lens as in the aforementioned other embodiments.

FIGS. 19A to 19D are views showing the laser beams, which are emitted from the laser emitters shown in FIG. 18, over time when the laser beams are a pulse type.

Figure 19A:
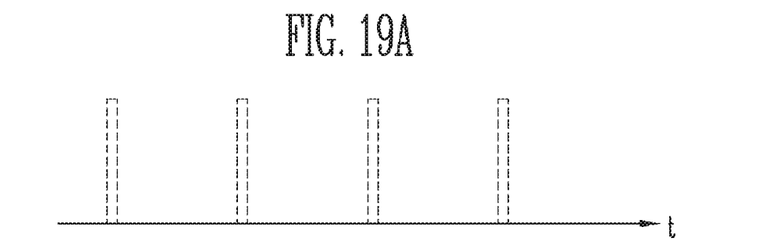
FIGS. 19A to 19D are views showing pulse-type laser beams, which are emitted from different laser emitters, on a time axis.
Figure 19B:
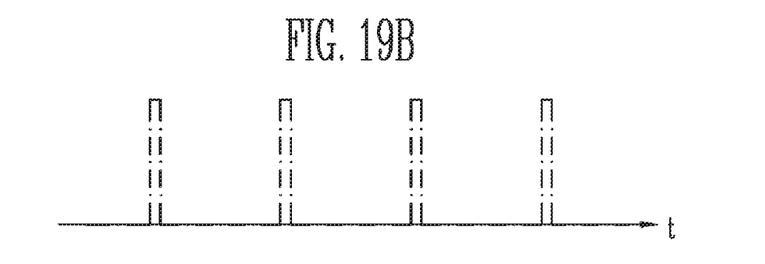
Figure 19C:
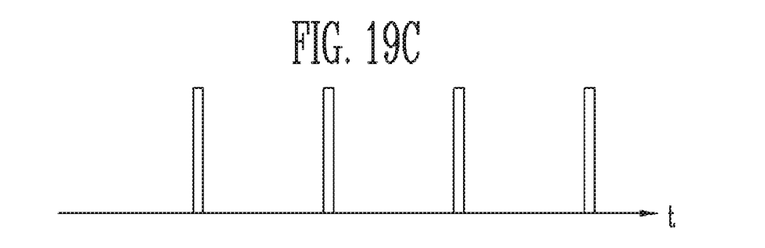

FIG. 19A shows laser beam pulses emitted from the laser emitter of reference numeral 310c on a time axis t, FIG. 19B shows laser beam pulses emitted from the laser emitter of reference numeral 310b on a time axis t, and FIG. 19C shows laser beam pulse emitted from the laser emitter of reference numeral 310a on a time axis t.

Figure 19D:
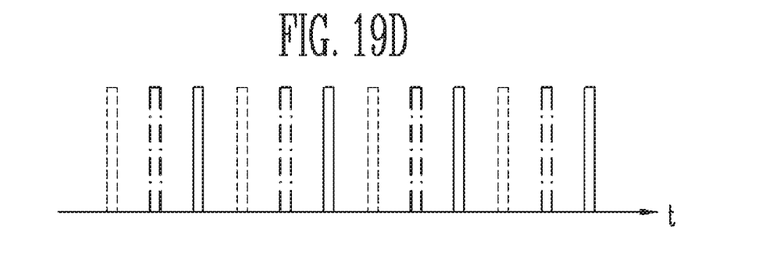

For a pulse laser such as a Q switching laser, a light pulse position may be adjusted over time, and pulses generated from the laser emitters may be interleaved on the time axis as in FIG. 19D.

A laser beam, which is emitted from a typical solid state laser emitter other than a semiconductor pumping laser emitter, has a single spatial mode. In this case, severe interference may occur, depending on the phase. Further, it is difficult to increase a repetition rate while pulse peak power is maintained using the single laser due to heat generation.

On the other hand, according to the present disclosure, a plurality of pulse-type laser beams are combined at the focal point of the second combination lens but are present on different time bands, and accordingly, interference may be reduced, and the repetition rate may be increased while peak power is maintained.

Figure 20:
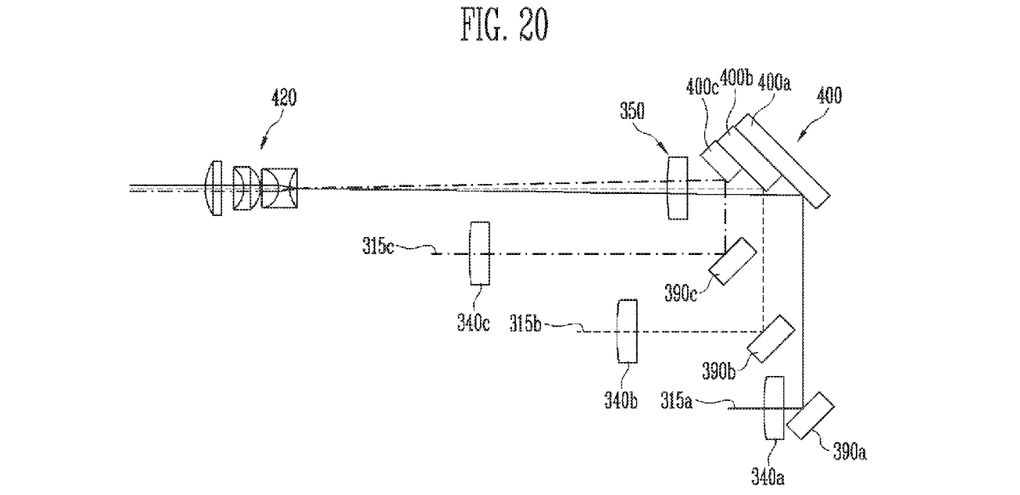
FIG. 20 is a view schematically showing a laser beam combination system according to a fifth embodiment of the present disclosure.

FIG. 20 is a view schematically showing a laser beam combination system according to a fifth embodiment of the present disclosure.

Referring to FIG. 20, the laser beam combination system according to the fifth embodiment of the present disclosure may include first combination lenses 340*a*, 340*b*, and 340*c*, first reflectors 390*a*, 390*b*, and 390*c*, a second reflector 400, a second combination lens 350, and a beam expander 420.

The first combination lenses 340*a*, 340*b*, and 340*c*, the first reflectors 390*a*, 390*b*, and 390*c*, and the second combination lens 350 are the same as those described in the aforementioned other embodiments, and thus, a detailed description thereof will be omitted.

The second reflector 400 may be provided to be positioned between the first reflectors 390*a*, 390*b*, and 390*c* and the second combination lens 350. Specifically, the second reflector 400 may be provided so that the progress direction of the laser beams 315*a*, 315*b*, and 315*c* reflected by the first reflectors 390*a*, 390*b*, and 390*c* are changed at an angle of 90° by the second reflector 400, and then, the laser beams 315*a*, 315*b*, and 315*c* are incident on the second combination lens 350.

The intervals between the laser beams 315*a*, 315*b*, and 315*c*, which are reduced by the first reflectors 390*a*, 390*b*, and 390*c*, may be further reduced while passing through the second reflector 400. That is, the combination efficiency of the laser beams 315*a*, 315*b*, and 315*c*, which are combined at the focal point of the second combination lens 350, may be increased.

Meanwhile, as shown in FIG. 20, the second reflectors 400 may be provided so that the number of second reflectors is the same as the number of laser beams, and may be layered in a stair form. The intervals between the second reflectors 400 should be reduced in order to maximally reduce the intervals between the laser beams 315*a*, 315*b*, and 315*c* and prevent the laser beams 315*a*, 315*b*, and 315*c* from being obstructed. Accordingly, when the second reflectors 400 are layered in a stair form, the intervals between the second reflectors 400 may be effectively reduced and the second reflectors 400 may be easily fixed.

Meanwhile, as described above, the intervals between the laser beams 315*a*, 315*b*, and 315*c* may be reduced to increase the combination efficiency of the laser beams 315*a*, 315*b*, and 315*c*. However, the combination efficiency may be increased using the second combination lens 350 having the long focal distance.

However, there is a drawback in that the entire size of the laser beam combination system is increased by the increased focal distance when the second combination lens 350 having the long focal distance is used. According to the present disclosure, the progress paths of the laser beams 315*a*, 315*b*, and 315*c* may be folded using the first reflectors 390*a*, 390*b*, and 390*c* and the second reflector 400, thus reducing the entire size of the system.

Next, the beam expander 420 may be positioned at the focal point of the second combination lens 350, and may function to increase the size of the combined laser beams and reduce the radiation angle. Specifically, the beam expander 420 may reduce the radiation angle by the size of the expanded laser beam (for example, when the size of the beam is increased by six times, the radiation angle is regulated to be reduced by six times).

Figure 21:
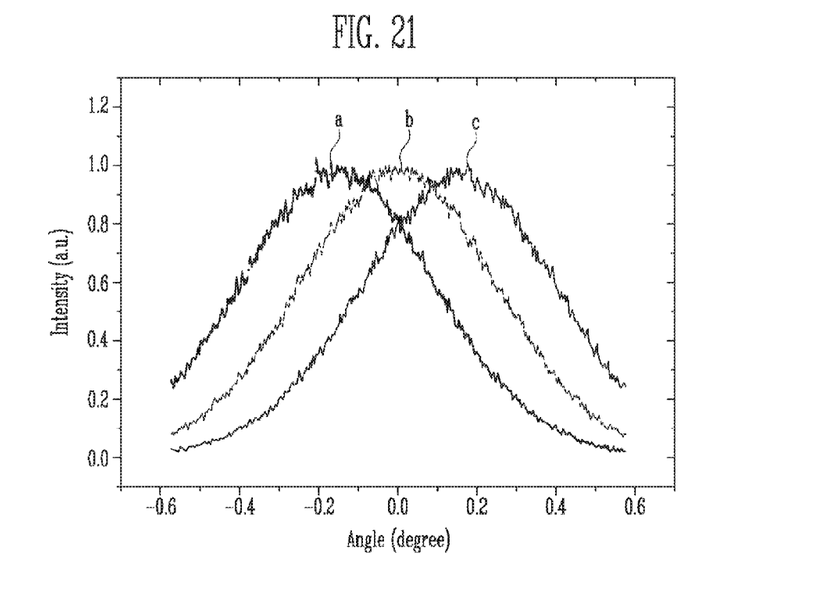
FIG. 21 is a view showing far-fields of laser beams passing through a beam expander of FIG. 20.

FIG. 21 is a view showing far-fields of the laser beams passing through the beam expander of FIG. 20.

For example, when the radiation angle of the laser beams combined at the focal point of the second combination lens 350 is about 1° before the laser beams are incident on the beam expander 420 and when the radiation angle is reduced to about 0.2° due to the beam expander 420, the beams are shown to be separated from each other by about 0.2° as in FIG. 21.

Meanwhile, it is apparent that the laser emitter array, the first collimation lens, and the second collimation lens are not shown in FIG. 20 for the convenience of description but the laser emitter array emitting the laser beam, and the first collimation lens and the second collimation lens provided between the laser emitter array and the first combination lens may be included as in the aforementioned other embodiments.

According to the present disclosure, laser beams may be combined using a laser diode bar to reduce the number of required parts and the assembling cost.

The laser beams may be combined using first and second combination lenses with the high combination efficiency to generate high-power light.

Furthermore, fourth combination lenses, which are disposed to have different heights, may be used to prevent a smile phenomenon from occurring, thereby increasing the combination efficiency.

In addition, single mode pulse-type laser beams may be combined to increase a pulse repetition rate while high peak power is maintained.

Meanwhile, the laser emitter array includes the three laser emitters in the present specification for the convenience of description, but the number of laser emitters is not limited thereto.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A laser beam combination system comprising:
   a laser emitter array including a plurality of laser emitters arranged therein;
   a first combination lens, through which a plurality of laser beams emitted from the laser emitters are concentrated in a first axis direction, so that the plurality of laser beams are converted to each have an oval cross-section having a long axis that is parallel to a second axis; and
   a second combination lens disposed at a focal point of the first combination lens to combine the plurality of laser beams converted by the first combination lens at a target,
   wherein the first combination lens and second combination lens have a curvature around an axis parallel to the second axis.

2. The laser beam combination system according to claim 1, wherein the plurality of laser emitters are disposed on a plane including a first axis and a third axis that is parallel to progress directions of the laser beams.

3. The laser beam combination system according to claim 2, wherein a laser emitter array is a laser diode bar.

4. The laser beam combination system according to claim 1, further comprising:

a first collimation lens disposed between the laser emitter array and the first combination lens to collimate the plurality of laser beams emitted from the laser emitters based on the second axis as a base axis; and a second collimation lens disposed between the first collimation lens and the first combination lens to collimate the laser beams passing through the first collimation lens based on a first axis as the base axis.

5. The laser beam combination system according to claim 1, wherein the first combination lens comprises a plurality of first combination lenses which corresponds to the number of laser emitters such that the first combination lenses correspond to the respective laser emitters.

6. The laser beam combination system according to claim 1, wherein the target is provided at a focal distance of the second combination lens, and lengths of the laser beams, which are combined at a focal point of the second combination lens, in the first axis direction are adjusted depending on the focal distance of the second combination lens.

7. The laser beam combination system according to claim 6, further comprising:
a third combination lens provided between the first combination lens and the second combination lens to have a curvature in a second axis direction,
wherein widths of a plurality of laser beams in the second axis direction are reduced as the laser beams pass through the third combination lens.

8. The laser beam combination system according to claim 1, further comprising:
fourth combination lenses provided between the first combination lens and the second combination lens to have a curvature in a second axis direction,
wherein the fourth combination lenses correspond in number to the plurality of laser emitters, and the fourth combination lenses control propagation paths of the laser beams corresponding to the positions of fourth combination lenses in the second axis direction.

9. The laser beam combination system according to claim 1, further comprising:
a first reflector provided between the first combination lens and the second combination lens,
wherein an interval between the laser beams passing through the first combination lens is reduced as the laser beams passing through the first combination lens are reflected by the first reflector.

10. The laser beam combination system according to claim 9, further comprising:
a second reflector provided between the first reflector and the second combination lens.

11. The laser beam combination system according to claim 10, wherein propagation paths of laser beams emitted from laser emitters are folded using the first reflector and the second reflector.

12. The laser beam combination system according to claim 9, further comprising:
a beam expander disposed at a focal point of the second combination lens.

13. The laser beam combination system according to claim 9, wherein a plurality of laser emitters emit pulse-type laser beams with predetermined time intervals.

14. The laser beam combination system according to claim 1, wherein the first combination lens and second combination lens are cylindrical lenses.

15. The laser beam combination system according to claim 14, wherein the first combination lens and second combination lens have a curvature in the first axis direction.

16. The laser beam combination system according to claim 1, wherein a center transmission axis of each respective laser beam, among the plurality of laser beams, upon exiting the first combination lens is co-linear with the center transmission axis of each respective laser beam upon exiting the first combination lens.

17. The laser beam combination system according to claim 1, wherein a center transmission axis of each laser beam, among the plurality of laser beams, is parallel to a center transmission axis of each other laser beam between the first combination lens and the second combination lens.

18. The laser beam combination system according to claim 1, wherein the first combination lens is configured to reduce a width of each of the plurality of laser beams while maintaining a distance between the plurality of laser beams, and
the second combination lens is configured to reduce a distance between the plurality of laser beams while increasing a width of the laser beams.

* * * * *